United States Patent
Lee et al.

(10) Patent No.: US 9,318,234 B2
(45) Date of Patent: Apr. 19, 2016

(54) INSULATING FILM AND PRODUCING METHOD FOR INSULATING FILM

(71) Applicant: SAMSUNG ELECTRO-MECHANICS CO., LTD., Suwon-si, Gyeonggi-do (KR)

(72) Inventors: Chung Hee Lee, Suwon-si (KR); Jae Choon Cho, Suwon-si (KR); Jong Yoon Jang, Suwon-si (KR); Hee Sun Chun, Suwon-si (KR); Jong Su Park, Suwon-si (KR); Sung Hyun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 114 days.

(21) Appl. No.: 14/013,568

(22) Filed: Aug. 29, 2013

(65) Prior Publication Data
US 2014/0065413 A1    Mar. 6, 2014

(30) Foreign Application Priority Data

Aug. 30, 2012 (KR) .......................... 10-2012-0095652

(51) Int. Cl.
| | |
|---|---|
| B32B 27/38 | (2006.01) |
| H01B 3/00 | (2006.01) |
| H01B 3/40 | (2006.01) |
| H01B 19/04 | (2006.01) |
| H01B 17/60 | (2006.01) |
| H05K 1/03 | (2006.01) |

(52) U.S. Cl.
CPC ................. *H01B 3/002* (2013.01); *H01B 3/40* (2013.01); *H01B 17/60* (2013.01); *H01B 19/04* (2013.01); *H05K 1/0366* (2013.01); *H05K 1/036* (2013.01); *H05K 1/0373* (2013.01); *H05K 2201/0209* (2013.01); *Y10T 428/265* (2015.01); *Y10T 428/31511* (2015.04)

(58) Field of Classification Search
None
See application file for complete search history.

(56) References Cited

U.S. PATENT DOCUMENTS

| | | | | |
|---|---|---|---|---|
| 2007/0119617 | A1* | 5/2007 | Hayashi et al. | ............... 174/260 |
| 2007/0191526 | A1* | 8/2007 | Jordan et al. | .................. 524/445 |
| 2010/0065314 | A1* | 3/2010 | Lin et al. | ...................... 174/258 |

FOREIGN PATENT DOCUMENTS

| | | |
|---|---|---|
| JP | 2001-332322 A | 11/2001 |
| JP | 2002-252470 A | 9/2002 |

OTHER PUBLICATIONS

Society for Mining, Metallurgy, and Exploration, Inc.—Industrial Minerals & Rocks: Commodities, Markets, and Uses. 7th edition, p. 1330, 2006. https://books.google.com/books?id=zNicdkuulE4C&pg=PA1330&dq=%22reinforcing+filler%22+silica&hl=en&sa=X&ei=jhBaVZe0Heq1sATCwoBA&ved=0CC8Q6AEwADgK#v=onepage&q=%22reinforcing%20filler%22%20silica&f=false.*

* cited by examiner

*Primary Examiner* — Coris Fung
(74) *Attorney, Agent, or Firm* — NSIP Law

(57) ABSTRACT

Disclosed herein are an insulating film and a producing method of the insulating film which can address problems caused by dents by providing a reinforcing layer having the weight ratio of the silica of 60 to 80 wt % on one surface of the insulating film.

3 Claims, 5 Drawing Sheets

- PRIOR ART -

- PRIOR ART -

100

US 9,318,234 B2

INSULATING FILM AND PRODUCING METHOD FOR INSULATING FILM

CROSS REFERENCE(S) TO RELATED APPLICATIONS

This application claims the benefit under 35 U.S.C. Section 119 of Korean Patent Application Serial No. 10-2012-0095652, entitled "Insulating Film and Producing Method for Insulating Film" filed on Aug. 30, 2012, which is hereby incorporated by reference in its entirety into this application.

BACKGROUND OF THE INVENTION

1. Technical Field

The present invention relates to an insulating film and a producing method for the insulating film, and more particularly, to an insulating film used in forming an insulating part on a PCB or the like, and a producing method for the insulating film.

2. Description of the Related Art

In general, an insulating film is produced by adding filler such as silica to an insulating resin such as an epoxy resin.

Here, the content of filler such as silica is less than half of the content of the insulating resin.

FIG. 1 is a diagram illustrating a typical insulating film according to the related art.

As shown, the typical insulating film according to the related art is produced such that a Polyethylene terephthalate (PET) film layer 200 and a Biaxially-Oriented Polypropylene (BOPP) film layer 300 are formed on both surfaces of an insulating layer 10 formed of an insulating resin and silica.

FIG. 2 is a diagram illustrating a substrate 400 having an insulating part formed on one or either surface using an insulating film according to the related art.

Referring to FIG. 2, the insulating part is formed on the surface of the substrate 400 with the insulating film formed only of the insulating layer 10.

Here, in the process of applying the insulating layer 10 on the surface of the substrate 400, a roll is commonly used.

In this regard, fine foreign substances may adhere to the surface of the roll, and such foreign substances may result in dents on the surface of the insulating layer 10 during the process of pressing the insulating layer 10 against the substrate 400.

Such dents may cause wiring defects during the process of forming a circuit pattern by performing plating process on the surface of the insulating layer, thereby reducing the production yield.

SUMMARY OF THE INVENTION

An object of the present invention is to provide an insulating film having a reinforcing layer so as to solve problems caused by dents.

Another object of the present invention is to provide a producing method of an insulating film having a reinforcing layer so as to solve problems caused by dents.

According to an exemplary embodiment of the present invention, there is provided an insulating film, including: a reinforcing layer formed on one surface, wherein a weigh ratio of silica of the reinforcing layer is between 60 and 80 wt %.

According to another exemplary embodiment of the present invention, there is provided an insulating film, including: an insulating layer including an insulating resin and silica, wherein a weight ratio of the silica is 50 wt % or less; and a reinforcing layer of one surface of which is in contact with one surface of the insulating layer and including an insulating resin and silica, wherein a weight ratio of the silica is between 60 and 80 wt %.

The insulating film may further include: a PET film layer provided on the other surface of the reinforcing layer; and a BOPP film layer provided on the other surface of the insulating layer.

A thickness of the reinforcing layer may be between 2 and 4 μm.

The insulating resin may be an epoxy resin.

According to an exemplary embodiment of the present invention, there is provided a producing method of an insulating film, including: preparing a first insulating material and a second insulating material, wherein the first insulating material includes an epoxy resin, silica and a solvent, content of the silica being less than content of the epoxy resin, and wherein the second insulating material includes an epoxy resin, silica and a solvent, content of the silica being 1.5 to 4.0 times than content of the epoxy resin; applying the first insulating material and the second insulating material so that the second insulating material is in contact with an upper surface of a PET film, and the first insulating material is in contact with a upper surface of the second insulating material; curing the first insulating material and the second insulating material to form a reinforcing layer including the first insulating material and an insulating layer including the second insulating material; and attaching a BOPP film on an upper surface of the insulating layer.

A thickness of the reinforcing layer may be between 2 and 4 μm.

DESCRIPTION OF THE PREFERRED EMBODIMENTS

Figure 1:
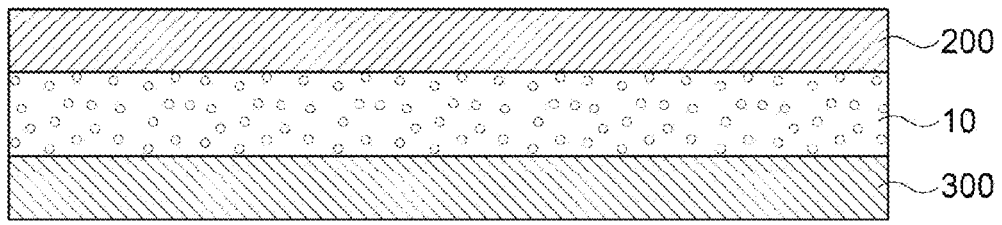
FIG. 1 is a diagram illustrating a typical insulating film according to the related art.
Figure 2:
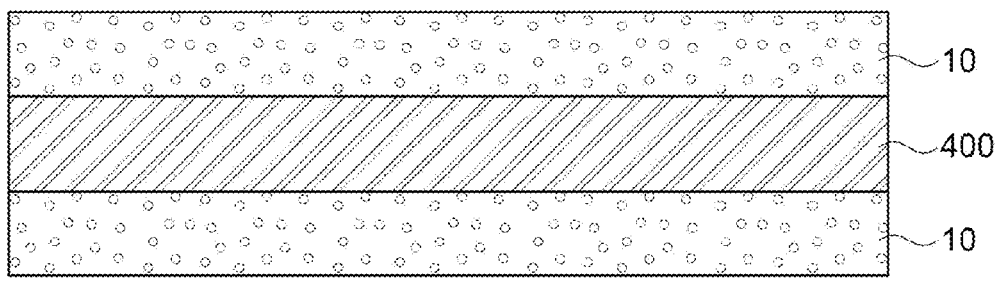
FIG. 2 is a diagram illustrating a substrate having insulating parts formed on both surfaces using an insulating film according to the related art.

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art. Like reference numerals denote like elements throughout the description.

Terms used in the present specification are for explaining exemplary embodiments rather than limiting the present invention. Unless specifically mentioned otherwise, a singular form includes a plural form in the present specification. Throughout this specification, the word "comprise" and variations such as "comprises" or "comprising," will be understood to imply the inclusion of stated constituents, steps, operations and/or elements but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure. Additionally, components shown in the accompanying drawings are not necessarily shown to scale. For example, sizes of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth", and the like, if any, will be used to distinguish similar components from each other and be used to describe a specific sequence or a generation sequence, but is not necessarily limited thereto. It may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top, "bottom", "over", "under", and the like, if any, do not necessarily indicate relative positions that are not changed, but are used for description. It may be understood that these terms are compatible with each other under an appropriate environment so that exemplary embodiments of the present invention to be described below may be operated in a direction different from a direction shown or described herein. The term "connected" used herein is defined as being directly or indirectly connected in an electrical or non-electrical way. The term "adjacent" may be defined as being in physical contact, being close to each other, or be in the same, common range or region, depending on the context in which the above term is used. Generally although not necessarily herein, the phrase "in an exemplary embodiment" refers to the same exemplary embodiment.

Hereinafter, a configuration and an acting effect of exemplary embodiments of the present invention will be described in more detail with reference to the accompanying drawings.

Figure 3:
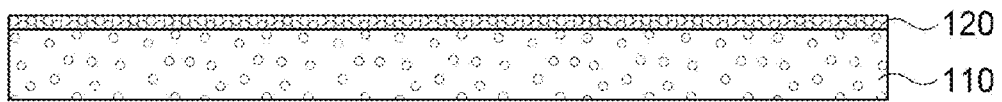
FIG. 3 is a simplified diagram showing the configuration of an insulating film according to an exemplary embodiment of the present invention.

FIG. 3 is a simplified diagram showing the configuration of an insulating film 100 according to an exemplary embodiment of the present invention.

Referring to FIG. 3, the insulating film 100 according to the exemplary embodiment of the present invention may include a reinforcing layer 120 and an insulating layer 110.

Like the insulating layer 10 of the typical insulating film according to the related art, the insulating layer 110 is formed of an insulating resin such as an epoxy resin and a filler such as silica, wherein the weight ratio of the silica is 50 wt % or less.

The reinforcing layer 120 is formed on one surface of the insulating layer 110 and serves to prevent dents.

The reinforcing layer 120 is formed of an insulating resin such as an epoxy resin and a filler such as silica, wherein the weight ratio of the silica is preferably between 60 and 80 wt %, unlike the insulating layer 110.

Further, the thickness of the reinforcing layer 120 is preferably between 2 and 4 μm.

Figure 4:
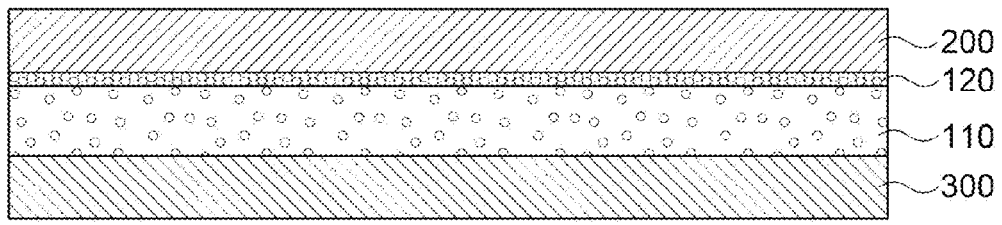
FIG. 4 is a simplified diagram showing the configuration of an insulating film according to another exemplary embodiment of the present invention.

FIG. 4 is a simplified diagram showing the configuration of an insulating film 100 according to another exemplary embodiment of the present invention.

Referring to FIG. 4, a PET film layer 200 may be provided on an upper surface of the reinforcing layer 120, and a BOPP film layer 300 may be provided on a lower surface 300 of the insulating layer 110.

Typically, the insulating film 100 is continuously produced by a roll-to-roll process so that it is provided during the producing process as it is being rolled. For this reason, the PET film layer 200 and the BOPP film layer 300 may be necessary.

Figure 5:
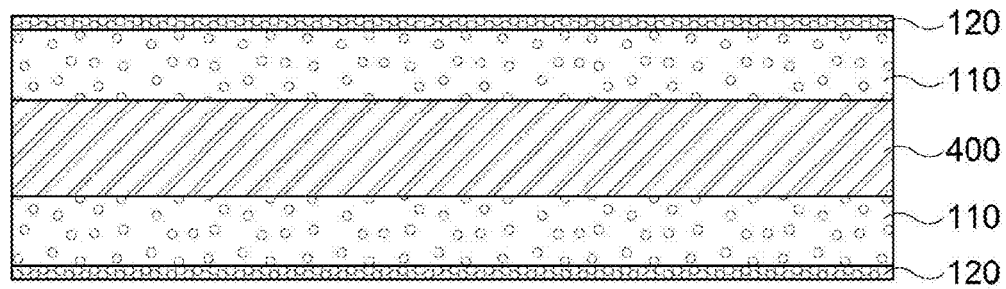
FIG. 5 is a diagram showing a substrate having insulating parts formed on both surfaces with the insulating film according to the exemplary embodiments of the present invention.

FIG. 5 is a diagram showing a substrate 400 having insulating parts formed on both surfaces with the insulating film 100 according to the exemplary embodiments of the present invention.

Referring to FIG. 5, it will be understood that, in forming an insulating part on either surface of the substrate 400 with the insulating film 100 according to the exemplary embodiment of the present invention, the insulating layer 110 is provided on either surface of the substrate 400 and the reinforcing layer 120 is provided on the outer surface of the insulating layer 110.

As shown, the insulating film 100 according to the exemplary embodiments of the present invention includes the reinforcing layer 120 on the surface which comes in direct contact of a roll during the process of forming the insulating part, such that the frequency of dent occurrence may be significantly lowered.

Figure 6:
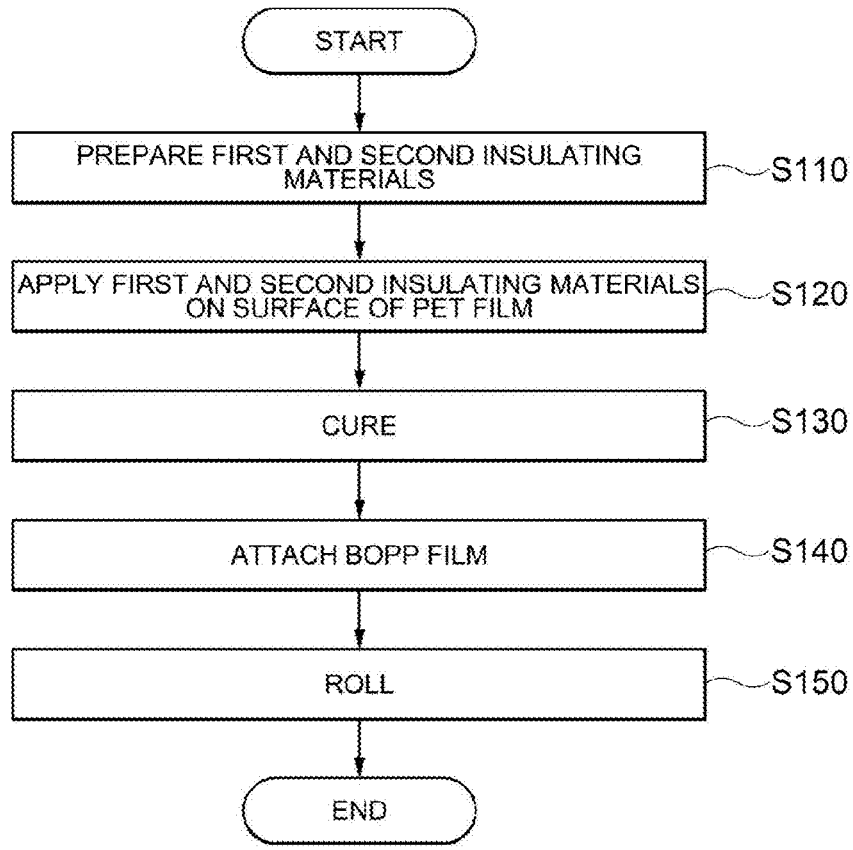
FIG. 6 is a flow chart schematically illustrating a producing method of an insulating film according to the exemplary embodiment of the present invention.

FIG. 6 is a flow chart schematically illustrating a producing method of an insulating film 100 according to an exemplary embodiment of the present invention.

Referring to FIG. 6, the producing method of the insulating film 100 according to the exemplary embodiment of the present invention may include: preparing a first insulating material and a second insulating material (S110); applying the first insulating material and the second insulating material on the surface of a PET film layer 200 (S120); curing the materials (S130); attaching a BOPP film layer 300 (S140).

The preparing of the first and second insulating materials may include mixing an insulating resin and silica with a solvent (S110).

Here, the first insulating material is used for forming the insulating layer 100, and is mixed so that the content of the silica is smaller than the content of the insulating resin.

The second insulating material is used for forming the reinforcing layer 120, and is mixed so that the content of the silica is preferably 1.5 to 4.0 times than that of the insulating resin.

The solvent serves to mix the insulating resin and the silica to make them in a liquid state, and is mostly volatilized and removed during the process of curing to be described below. Any known solvent used in producing conventional insulating film 100 may be used, and thus detailed description thereof will not be made.

Here, an epoxy resin may be used for the insulating resin.

Subsequently, the first insulating material and the second insulating material are applied onto the upper surface of the PET film layer 200 (S120).

Here, the second insulating material for forming the reinforcing layer 120 may be firstly applied onto the upper surface of the PET film layer 200 so that it covers most of the upper surface. Then, the first insulating material may be applied onto the upper surface of the second insulating material so as to form the insulating layer 110.

Alternatively, the process may be performed in a such manner that the second insulating material is applied and then the first insulating material is applied.

Alternatively, by locating a nozzle for providing the second insulating material on a lower side while a nozzle for providing the first insulating material on a upper side, the first and second insulating materials may be simultaneously applied in a such manner that the second insulating material is applied onto the upper surface of the PET film layer 200 while the first insulating material is applied onto the second insulating material.

In this case, the time period required for producing the insulating film 100 may be shortened, compared to the previous cases.

Subsequently, the curing process is performed by blowing around the first and second insulating materials for a predetermined time period (S130).

Next, upon completion of the curing, a BOPP film layer 300 may be attached on the surface of the insulating layer 110 formed of the second insulating material for rolling and packaging (S140).

Finally, the insulating film 100 having the BOPP film layer 300 attached thereon may be rolled (S150).

Figure 7A:
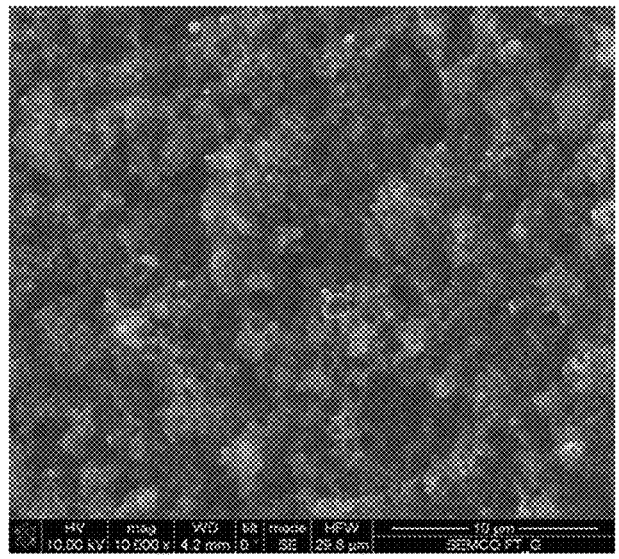
FIG. 7A is a photograph taken with a scanning electron microscope, showing the surface of the substrate on which the insulating film having silica content of 55 wt % of the reinforcing layer is attached.
Figure 7B:
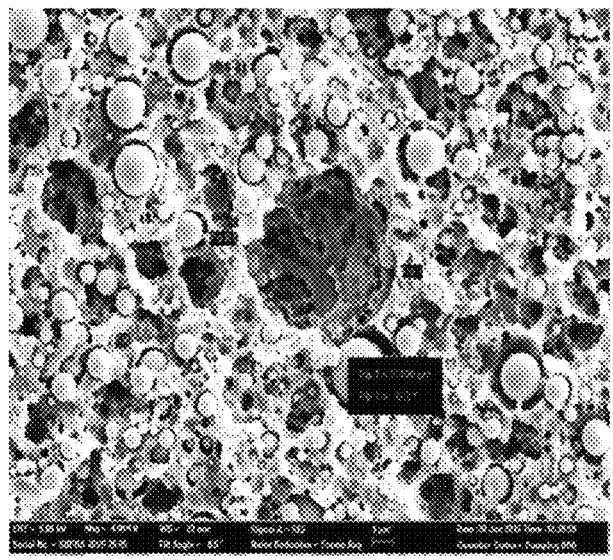
FIG. 7B is a photograph taken with a scanning electron microscope, showing the surface of the substrate on which the insulating film having silica content of 55 wt % of the reinforcing layer is attached and surface finish is performed.
Figure 8A:
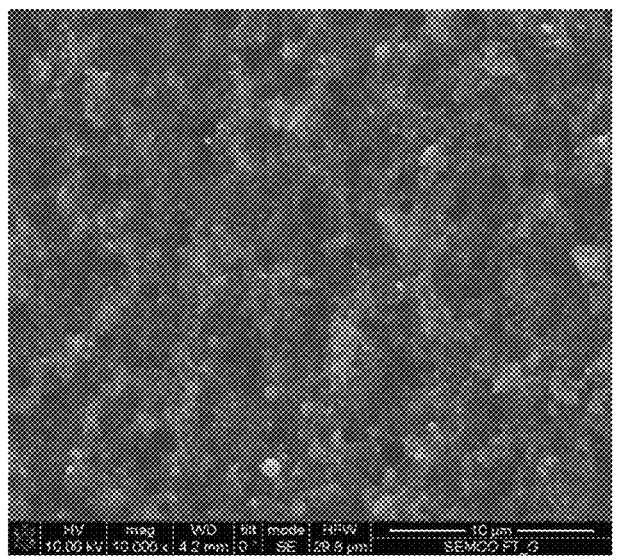
FIG. 8A is a photograph taken with a scanning electron microscope, showing the surface of the substrate on which the insulating film having silica content of 70 wt % of the reinforcing layer is attached.
Figure 8B:
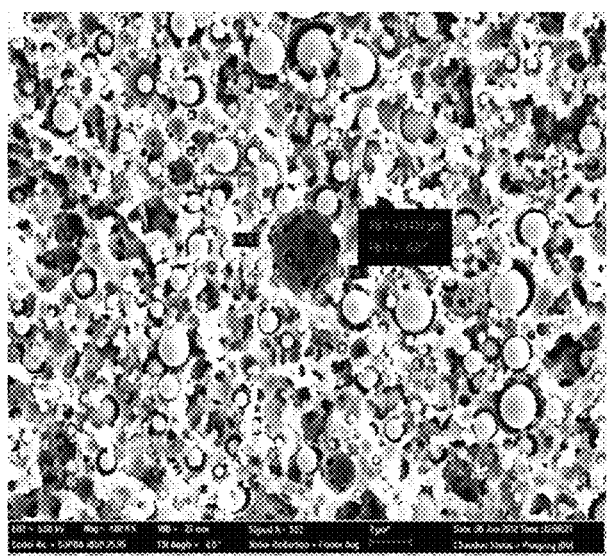
FIG. 8B is a photograph taken with a scanning electron microscope, showing the surface of the substrate on which the insulating film having silica content of 70 wt % of the reinforcing layer is attached and surface finish is performed.

FIG. 7A is a photograph taken with a scanning electron microscope, showing the surface of the substrate 400 on which the insulating film 100 having silica content of 55 wt % of the reinforcing layer 120 is attached; FIG. 7B is a photograph taken with a scanning electron microscope, showing the surface of the substrate 400 on which the insulating film 100 having silica content of 55 wt % of the reinforcing layer 120 is attached and surface finish is performed; FIG. 8A is a photograph taken with a scanning electron microscope, showing the surface of the substrate 400 on which the insulating film 100 having silica content of 70 wt % of the reinforcing layer 120 is attached; FIG. 8B is a photograph taken with a scanning electron microscope, showing the surface of the substrate 400 on which the insulating film 100 having silica content of 70 wt % of the reinforcing layer 120 is attached and surface finish is performed; and FIG. 9 is a photograph taken with a scanning electron microscope, showing the surface of the substrate 400 on which the insulating film 100 having silica content of 85 wt % of the reinforcing layer 120 is attached.

The following can be seen from FIGS. 7A and 7B, 8A and 8B, and 9. When the silica weight ratio of the reinforcing layer 120 is 55 wt % (FIGS. 7A and 7B), a number of dents having relatively large sizes occur. In contrast, when the silica weight ratio of the reinforcing layer 120 is 70 wt % (FIGS. 8A and 8B), less number of dents having relatively small sizes occur, compared to the example shown in FIGS. 7A and 7B.

Figure 9:
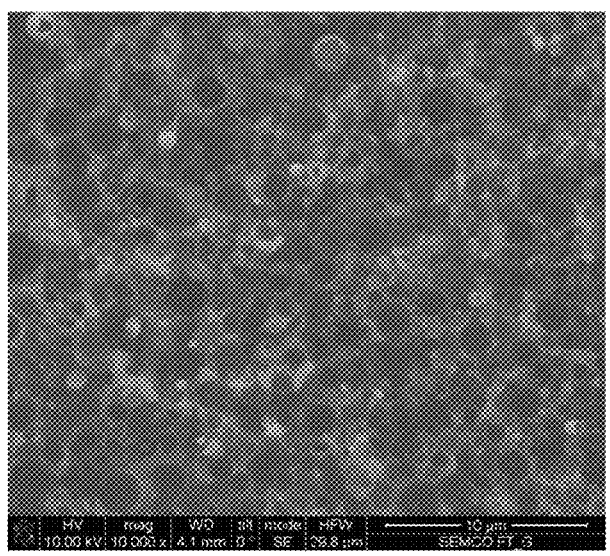
FIG. 9 is a photograph taken with a scanning electron microscope, showing the surface of the substrate on which the insulating film having silica content of 85 wt % of the reinforcing layer is attached.

Moreover, as can be seen from FIG. 9, when the silica weight ratio is 85 wt %, cracks already occur even before surface finish.

It is presumed that the cracks result from the difference in expansion and contraction of the lower surface.

Here, the surface finish refers to forming an insulating part on the surface of the substrate 400 and treating the surface with a chemical material prior to plating, and is also referred as a Desmear process.

In summary, the frequency of dent occurrence may be reduced as the silica content increases; however, cracks may occur if the silica content overly increases.

Further, taking into consideration that the grain size of the silica filler commonly used for the insulating film 100 is about 1 to 3 μm, it is desired that the thickness of the reinforcing layer 120 is about 2 to 4 μm, in order to effectively prevent dent occurrence.

As stated above, the insulating film according to the exemplary embodiments of the present invention has the reinforcing layer thereon and can address problems caused by dents.

Further, according to the producing method of the insulating film according to the exemplary embodiments of the present invention, the producing process can be quickly carried out.

What is claimed is:

1. An insulating film, comprising:
   an insulating layer including an insulating resin and silica, wherein a weight ratio of the silica is 50 wt % or less of the insulating layer;
   a reinforcing layer of one surface of which is in contact with one surface of the insulating layer and including an insulating resin and silica, wherein a weight ratio of the silica is between 60 and 80 wt % of the reinforcing layer;
   a PET (polyethylene terephthalate) film layer provided on the other surface of the reinforcing layer; and
   a BOPP (biaxially oriented polypropylene) film layer provided on the other surface of the insulating layer.

2. The film according to claim 1, wherein a thickness of the reinforcing layer is between 2 and 4 μm.

3. The film according to claim 1, wherein the insulating resin of at least one of the insulating layer and the reinforcing layer is an epoxy resin.

* * * * *